March 12, 1963 R. L. WATTERS 3,081,436

NEGATIVE RESISTANCE DIODE OSCILLATOR

Filed Dec. 15, 1959

Inventor:
Robert L. Watters,
by John F. Ahern
His Attorney.

3,081,436
Patented Mar. 12, 1963

3,081,436

NEGATIVE RESISTANCE DIODE OSCILLATOR

Robert L. Watters, Schenectady, N.Y., assignor to General Electric Company, a corporation of New York Filed Dec. 15, 1959, Ser. No. 859,668
5 Claims. (Cl. 331—107)

This invention relates to frequency controlled oscillator circuits and more particularly to crystal controlled oscillator circuits using semiconductor devices.

The semiconductor device used by this invention exhibits a region of strong negative resistance in the forward low voltage portion of its current-voltage characteristic.

In order for a semiconductor diode device to operate in this way it must be impregnated with a significant impurity on both the P-type and N-type side of concentration sufficiently high to make the device degenerate. By a degenerate semiconductor is meant a body of semiconductor to which has been added sufficient donor impurity so that the Fermi-level for electrons is higher in energy than the conduction band edge; or to which has been added sufficient acceptor impurity so that the Fermi-level has been depressed to a lower energy than the valence band edge.

The interpretation of the negative resistance phenomenon is based on the fact that carriers can cross the junction by means of the quantum-mechanical tunnel effect. In order for this to be a likely process, however, the junction must be narrow because the dependence of the barrier penetration factor on the barrier thickness is very strong.

As used herein a narrow junction degenerate semiconductor diode device refers to a semiconductor diode having a junction width of less than 200 angstrom units and excess donor and acceptor impurity concentrations greater than $10^{18}$ atoms per cubic centimeter on either side of the junction respectively. The junction may be formed by known alloying techniques suitably controlled to produce this structure. Such a semiconductor device exhibits a negative resistance at low forward voltages. For example, the range of the negative resistance characteristic is from about .04 to 0.3 volt for a germanium device; about .08 to 0.4 volt for a silicon device and about .03 to 0.3 volt for gallium antimonide device.

For further details concerning the semiconductor diode device utilized in this invention reference may be had to the copending application of Jerome J. Tiemann, Serial No. 858,995, filed December 11, 1959, now abandoned, and assigned to the assignee of the present application.

It is an object of this invention to provide a new and improved crystal controlled oscillator circuit using a narrow junction degenerate semiconductor diode device.

It is another object of this invention to provide a new and improved crystal controlled oscillator circuit which combines simple construction and high selectivity.

Still another object of this invention is to provide a new and improved crystal controlled oscillator which allows a substantial reduction in circuit components.

It is another object of this invention to provide a crystal controlled oscillator circuit which operates at low power levels.

Briefly stated, in accord with one aspect of this invention, the frequency controlled oscillator circuit comprises a narrow junction degenerate semiconductor diode having a negative resistance characteristic at low forward voltages. A source of voltage and means in circuit therewith biases the diode for operation on the negative resistance region of its current-voltage characteristic. A frequency selective network including inductance, capacitance and a piezoelectric crystal in parallel circuit relationship with the diode provides the highest impedance to the diode only at the parallel resonant frequency of the piezoelectric crystal.

My invention will be better understood from the following description taken in connection with the accompanying drawings and its scope will be apparent from the appended claims.

Figure 1:
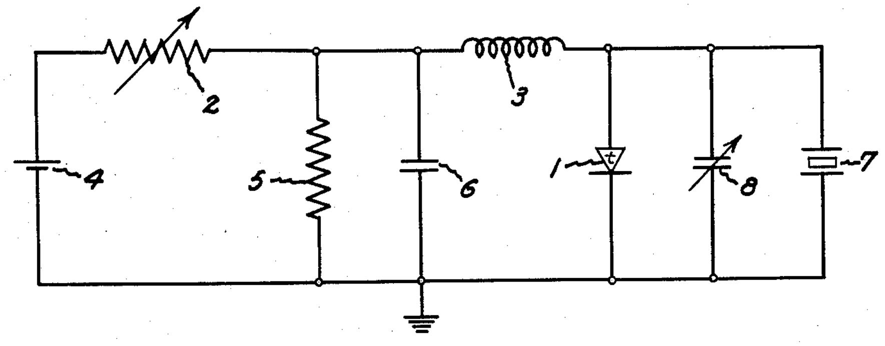
FIG. 1 is a schematic illustration of an oscillator circuit constructed in accord with this invention.

Referring now to the drawings in more detail, FIG. 1 shows a crystal controlled oscillator including narrow junction semiconductor diode 1 as the active element thereof.

Semiconductor diode 1 is connected in series with bias adjusting resistance 2, inductance 3 and voltage source 4. Resistor 5 and capacitor 6 are connected from the junction of resistor 2 and inductance 3 to the other side of the voltage source. Piezoelectric crystal 7, shunted by a variable tuning capacitor 8, is connected in parallel with the semiconductor diode 1. These are all the components required for this novel crystal controlled oscillator circuit.

Figure 2:
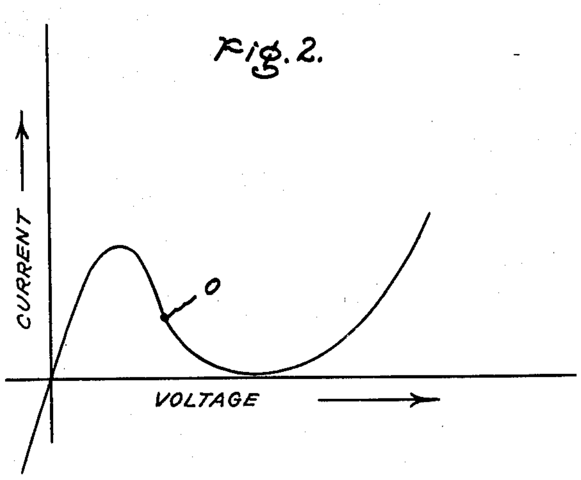
FIG. 2 is a characteristic curve of a semiconductor diode device which may be utilized in the circuit of this invention.

In operation, diode 1 is biased so as to have its operating point on the negative resistance region of the current-voltage characteristic such as shown at O in FIG. 2. The bias may be provided by voltage source 4 and resistance 2 and 5. Resistor 5 is selected to have a value less than the absolute value of the negative resistance of diode 1 and is usually small with respect to resistor 2. Resistor 2 reduces the voltage of source 4 so as to provide the low voltage across the diode necessary for operation in the negative resistance region. As shown hereinbefore the voltage required for such operation is in the range less than one volt.

In order for the circuit to oscillate the impedance to the diode must be higher than the absolute value of the negative resistance. A frequency selective network including inductance 3, capacitance 6 and piezoelectric crystal 7 is connected in parallel circuit relation with the diode and provides an impedance, at the parallel resonant frequency of the crystal, which is greater than the absolute value of the negative resistance. The circuit therefore oscillates at this frequency.

It is well-known that a piezoelectric crystal has both a series resonant mode, where it exhibits a minimum impedance and a parallel resonant mode where it exhibits a maximum impedance. In the crystal controlled oscillator circuit of this invention the crystal operates at its parallel resonant mode.

After piezoelectric crystal 7, having a predetermined parallel resonant frequency, has been selected, the values of inductance 3 and capacitor 6 can be selected such that the network will have a high impedance at this frequency. It is required, however, that this impedance be greater than the absolute value of the negative resistance. The value of negative resistance is determined by the particular narrow junction semiconductor diode used. The highest impedance to the diode, therefore, will always be at the parallel resonant frequency of the crystal. Since the diode will oscillate at the point of highest impedance, it will oscillate at this frequency only.

By way of example only, assuming a narrow junction diode with an absolute value of negative resistance of 100 ohms and a quartz crystal having a fundamental parallel resonant frequency of 18 megacycles, the following circuit parameters would be set as follows:

$R_5$=50 ohms
$L_3$=5 microhenries
$C_6$=0.1 mircrofarads where $R_5$=resistance 5
$L_3$=inductance 3
$C_6$=capacitance 6

The parallel resonant frequency of the crystal may be varied slightly by means of variable capacitor 8. Alternatively, capacitor 8 may be replaced by a variable inductance and suitable series by-pass capacitor to provide for changing the point of resonance.

While only certain preferred features of the invention have been shown by way of illustration, many modifications will occur to those skilled in the art and it is, therefore, to be understood that the appended claims are intended to cover all such modifications as fall within the true spirit and scope of the invention.

What I claim as new and desire to secure by Letters Patent of the United States is:

1. A frequency controlled oscillator circuit comprising: a narrow junction degenerate semiconductor diode device exhibiting a negative resistance region in the low forward voltage range of its current-voltage characteristic; bias means in circuit with said diode device establishing a direct current operating point therefor in said negative resistance region; a piezoelectric crystal having a predetermined parallel resonant frequency connected in parallel circuit relation with said diode device; an inductance; and means effectively connecting said inductance in series circuit with said diode at zero frequency and in parallel therewith near the selected parallel resonant frequency of said crystal, said inductance, a piezoelectric crystal and connecting means forming a frequency determining network for said diode device having its highest impedance only at the selected parallel resonant frequency of said crystal.

2. A frequency controlled oscillator circuit comprising: a frequency determining network including a piezoelectric crystal having a predetermined parallel resonant frequency, a capacitance and an inductance forming respectively the two shunt branches and the series branch of a pi-type section, the highest impedance of said network being at the selected parallel resonant frequency of said piezoelectric crystal; a narrow junction degenerate semiconductor diode device exhibiting a negative resistance region in the low forward voltage range of its current-voltage characteristic; means connecting said diode device in parallel circuit relationship with said piezoelectric crystal whereby the highest impedance of said frequency determining network is across said diode device; and bias means in circuit with said diode device and said frequency determining network establishing a direct current operating point for said diode device in said negative resistance region.

3. A crystal controlled oscillator circuit comprising: a frequency determining network including a piezoelectric crystal having a predetermined parallel resonant frequency, a capacitance and an inductance forming respectively the two shunt branches and the series branch of a pi-type section, said network having its highest impedance at a selected parallel resonant frequency of said crystal; a narrow junction degenerate semiconductor diode device exhibiting a negative resistance region in the low forward voltage range of its current-voltage characteristic; means connecting said diode device in parallel circuit relationship with said piezoelectric crystal; bias means in circuit with said diode device and said frequency determining network establishing a direct current operating point for said diode in said negative resistance region; and means for varying the parallel resonant frequency of said piezoelectric crystal.

4. A crystal controlled oscillator circuit comprising: a voltage source, a first resistance; an inductance; a narrow junction degenerate semiconductor diode device exhibiting a negative resistance region in the low forward voltage range of its current-voltage characteristic; means connecting said voltage source, said first resistance, said inductance and said diode device in series circuit relationship; a second resistance connected from the common junction between said first resistance and said inductance to the other side of said voltage source, said voltage source, first and second resistances and said inductance providing a direct current bias circuit for said diode device to establish a direct current operating point therefor in said negative resistance region; a capacitance connected from one side of said inductance to the other side of said voltage source; a piezoelectric crystal having a predetermined parallel resonant frequency connected from the other side of said inductance to the other side of said voltage source, the combination of said capacitance, said inductance and said piezoelectric crystal providing the highest impedance across said diode device only at the selected parallel resonant frequency of said crystal whereby oscillations are produced at a frequency corresponding thereto.

5. A crystal controlled oscillator circuit comprising: a voltage source; a first resistance; an inductance; a narrow junction degenerate semiconductor diode device exhibiting a negative resistance region in the low forward voltage range of its current-voltage characteristic; means connecting said voltage source, said first resistance, said inductance and said diode device in series circuit relationship; a second resistance connected from one side of said voltage source to the junction between said first resistance and one side of said inductance, said voltage source, first and second resistance and said inductance providing a direct current biasing circuit portion for said diode device establishing a direct current operating point therefor in said negative resistance region; a capacitance connected from said one side of said voltage source to said one side of said inductance; a piezoelectric crystal having a predetermined parallel resonant frequency connected from said one side of said voltage source to the other side of said inductance, said piezoelectric crystal thereby being in parallel circuit relationship with said diode device and forming one shunt branch of a pi-type section which includes a series inductance branch, and a second shunt branch including said capacitance to provide the highest impedance across said diode only at the selected parallel resonant frequency of said crystal; and means for varying the parallel resonant frequency of said piezoelectric crystal.

References Cited in the file of this patent

UNITED STATES PATENTS

| | | |
|---|---|---|
| 2,469,569 | Ohl | May 10, 1949 |
| 2,506,762 | Antalek | May 9, 1950 |

FOREIGN PATENTS

| | | |
|---|---|---|
| 158,879 | Australia | Sept. 16, 1954 |

OTHER REFERENCES

Electronics, p. 61, Aug. 7, 1959.

"Tunnel Diodes as High-Freq. Devices" by Sommers, Junior, in Proc. of the I.R.E., pages 1201–1206.